(12) United States Patent
Hollis et al.

(10) Patent No.: US 9,773,542 B2
(45) Date of Patent: Sep. 26, 2017

(54) SOURCE-SYNCHRONOUS DATA TRANSMISSION WITH NON-UNIFORM INTERFACE TOPOLOGY

(71) Applicant: QUALCOMM Incorporated, San Diego, CA (US)

(72) Inventors: Timothy Mowry Hollis, San Diego, CA (US); Michael Joseph Brunolli, Escondido, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/348,897

(22) Filed: Nov. 10, 2016

(65) Prior Publication Data

US 2017/0062042 A1    Mar. 2, 2017

Related U.S. Application Data

(62) Division of application No. 14/302,806, filed on Jun. 12, 2014, now Pat. No. 9,524,763.

(51) Int. Cl.
| | |
|---|---|
| *H03K 17/16* | (2006.01) |
| *H03K 19/003* | (2006.01) |
| *G11C 11/4076* | (2006.01) |
| *G06F 13/42* | (2006.01) |
| *G11C 5/06* | (2006.01) |

(Continued)

(52) U.S. Cl.
CPC ...... *G11C 11/4076* (2013.01); *G06F 13/4086* (2013.01); *G06F 13/4243* (2013.01); *G11C 5/063* (2013.01); *G11C 7/02* (2013.01); *G11C 7/1048* (2013.01); *G11C 7/1057* (2013.01); *G11C 7/1066* (2013.01); *G11C 7/1069* (2013.01); *G11C 7/1072* (2013.01); *G11C 7/1084* (2013.01); *G11C 7/1093* (2013.01); *G11C 7/222* (2013.01); *G11C 11/4093* (2013.01); *G11C 11/4096* (2013.01); *G11C 29/022* (2013.01); *G11C 29/023* (2013.01); *G11C 29/028* (2013.01); *H03K 19/018521* (2013.01); *H03K 19/018528* (2013.01); *H03K 19/018557* (2013.01); *H04L 25/0278* (2013.01); *H04L 25/0298* (2013.01);

(Continued)

(58) Field of Classification Search
CPC .............. G11C 7/222; H03K 19/018521
USPC .................. 326/30, 83; 365/189.17; 710/305
See application file for complete search history.

(56) References Cited

U.S. PATENT DOCUMENTS

| 7,251,740 B2 | 7/2007 | Newman |
|---|---|---|
| 8,565,032 B2 | 10/2013 | Abe |

(Continued)

FOREIGN PATENT DOCUMENTS

| EP | 2575138 A2 | 4/2013 |
|---|---|---|
| JP | H07321828 A | 12/1995 |

(Continued)

OTHER PUBLICATIONS

Application Note 3662, "Understanding LVDS Fail-Safe Circuits", Maxim integrated, Mar. 22, 2006, 7 pages.

(Continued)

*Primary Examiner* — Daniel D Chang
(74) *Attorney, Agent, or Firm* — Haynes and Boone, LLP (36340)

(57) ABSTRACT

A source-synchronous system is provided in which a non-uniform interface may exist in a data source endpoint as well as in a data sink endpoint.

15 Claims, 7 Drawing Sheets

(51) Int. Cl.
*G11C 7/02* (2006.01)
*G11C 7/10* (2006.01)
*G11C 11/4096* (2006.01)
*G11C 29/02* (2006.01)
*H03K 19/0185* (2006.01)
*H04L 25/02* (2006.01)
*G11C 7/22* (2006.01)
*G06F 13/40* (2006.01)
*G11C 11/4093* (2006.01)

(52) U.S. Cl.
CPC ..... *G11C 2207/105* (2013.01); *Y02B 60/1228* (2013.01); *Y02B 60/1235* (2013.01)

(56) References Cited

U.S. PATENT DOCUMENTS

| | | | | |
|---|---|---|---|---|
| 8,964,483 | B2* | 2/2015 | Kajigaya | H01L 23/498 365/189.011 |
| 2004/0100838 | A1 | 5/2004 | Tamura et al. | |
| 2004/0124893 | A1* | 7/2004 | Falconer | H03L 7/00 327/141 |
| 2004/0218434 | A1 | 11/2004 | Hwang et al. | |
| 2007/0217258 | A1 | 9/2007 | Wang | |
| 2008/0144405 | A1 | 6/2008 | Teh et al. | |
| 2008/0256281 | A1 | 10/2008 | Fahr et al. | |
| 2010/0061165 | A1 | 3/2010 | Cook | |
| 2010/0327902 | A1 | 12/2010 | Shau | |
| 2011/0057722 | A1 | 3/2011 | Komyo et al. | |
| 2011/0075496 | A1 | 3/2011 | Mueller | |
| 2012/0326746 | A1 | 12/2012 | McCall et al. | |
| 2013/0082404 | A1* | 4/2013 | Kajigaya | H01L 23/498 257/777 |
| 2015/0364171 | A1 | 12/2015 | Hollis et al. | |

FOREIGN PATENT DOCUMENTS

| | | |
|---|---|---|
| JP | 2002230963 A | 8/2002 |
| JP | 2011061393 A | 3/2011 |
| JP | 2013507040 A | 2/2013 |

OTHER PUBLICATIONS

International Search Report and Written Opinion—PCT/US2015/031147—ISA/EPO—dated Oct. 9, 2015.

* cited by examiner

SOURCE-SYNCHRONOUS DATA TRANSMISSION WITH NON-UNIFORM INTERFACE TOPOLOGY

CROSS REFERENCE TO RELATED APPLICATIONS

This application is a divisional of U.S. application Ser. No. 14/302,806, filed Jun. 12, 2014.

TECHNICAL FIELD

This application relates to source-synchronous data transmission and reception over non-uniform interfaces.

BACKGROUND

In source-synchronous systems, a data source endpoint sends data through a data channel to a data sink endpoint. In addition, the data source endpoint transmits a data strobe (e.g., a clock signal) over a data strobe channel to the data sink endpoint. The data sink uses the clock to latch or register the received data. As compared to the use of a system clock for transferring data, source-synchronous systems typically achieve considerably higher data rates. In a single-data-rate-source-synchronous system, the data is latched at the data sink on just one clock edge such as the rising edge. But in a double-data-rate (DDR) source-synchronous system, the data is latched on both the rising and falling edges. DDR data transmission is thus twice as fast as single data rate transmission at the same data strobe frequency.

Because of this speed advantage, double data rate signaling standards such as LPDDR4 (Low Power Double Data Rate 4) are quite popular for the reading and writing of data. For example, a microprocessor may write to a memory such as a dynamic random access memory (DRAM) by transmitting both a DDR data strobe and a data signal. It is conventional for the data strobe and the data signal to be carried on balanced paths. Not only are the on and off-chip routes for the data strobe and the data matched but the circuitry within the paths such as the drivers and terminations are also matched.

An example source-synchronous system 10 including a data source endpoint 101 such as an SOC and a data sink endpoint 102 such as a dynamic random access memory is shown in FIG. 1. System 10 is a double-data-rate system such that data source 101 transmits both a true data strobe that propagates over a true data strobe channel (DQST) to data sink 102 as well as a complement data strobe that propagates through a data strobe complement channel (DQSC) to data sink 102. A corresponding data signal propagates over a data channel (DQ). The electrical lengths of the data channel as well the true and complement data strobe channels is such that they may be treated as transmission lines having a characteristic impedance. To prevent reflections on these transmission lines, data receiver 102 includes on-die terminations each having an impedance that matches the characteristic impedance of the corresponding transmission lines. In particular, the DQST strobe channel ends in a termination 100, the DQSC strobe channel ends in a termination 105, and the DQ strobe channel ends in a termination 110. It is conventional that the DQSC, DQST, and DQ channels all have the same characteristic impedance and electrical length. In that regard, terminations 100, 105, and 110 all have a corresponding matching resistor R in parallel with a capacitor C that matches the termination impedances to the characteristic impedance for their corresponding channels. To further match the channels, a true data strobe driver 115, a complement data strobe driver 120, and a data driver 125 are all matching single-ended drivers comprising an inverter formed from a PMOS transistor P1 and an NMOS transistor M1.

System 10 works well at lower data rates. But as data rates are increased, power consumption goes up and the matching of the channels becomes more problematic. Accordingly, there is a need in the art for improved source-synchronous system architectures.

SUMMARY

A source-synchronous system is provided with non-uniform interfaces to the data strobe and data channels. The source-synchronous system includes both a data source endpoint and a data sink endpoint. At least one data strobe channel couples between the data source endpoint and the data sink endpoint. Similarly, at least one data channel couples between the data source endpoint and the data sink endpoint.

For the data source endpoint, the non-uniform interface relates to a mismatch between a data strobe driver for driving the data strobe channels and a data driver for driving the data channel. In one embodiment, the data strobe driver may comprise a differential driver whereas the data driver may comprise a single-ended driver.

The non-uniform interface in the data sink endpoint relates to a mismatch between the terminations for the data strobe and data channels. In one embodiment, the data strobe terminations may be capacitive terminations that are not matched to a resistive impedance for the data strobe channels. In contrast, the data channel terminations may each comprise a resistive termination that matches a resistive impedance for the data channels.

The non-uniform interfaces are quite advantageous. For example, substantial power is saved by using on-die capacitive terminations for the data strobe channels. In contrast, the on-die data resistive channel terminations match the impedance of the data channels. Data signals are thus not reflected yet power is saved by the elimination of matching resistive terminations for the data strobe channels. In addition, larger eyes are produced for the true and complement data strobe channels through the use of a differential driver. These and other advantageous features may be better appreciated through the following detailed description.

BRIEF DESCRIPTION OF THE DRAWINGS

Embodiments of the disclosed source-synchronous endpoints and their advantages are best understood by referring to the detailed description that follows. It should be appreciated that like reference numerals are used to identify like elements illustrated in one or more of the figures.

DETAILED DESCRIPTION

A source synchronous system is provided having a non-uniform interface with regard to the data strobe and data channels that couple between a data source endpoint and a data sink endpoint. For the data source endpoint, the non-uniform interface may relate to the drivers for the data strobe channels and for the data channels. For example the data strobe driver may be a differential data strobe driver whereas the data drivers may be single-ended drivers. Another non-uniformity between the drivers may relate to their power networks. The power and ground network for the data strobe driver may be independent from the power network for the data drivers.

In the channels, the non-uniformity may comprise the use of distinct metal layers for the data strobe channels as compared to a metal layer used for the data channels. In the data sink endpoint, the non-uniformity may relate to the on-die terminations for the data strobe and data channels. The data channels end in corresponding on-die resistive terminations in the data sink that have an impedance matching the resistive characteristic impedance of the data channels as is conventionally practiced. This resistive characteristic impedance depends upon the data channel design. For example, it may be 50Ω, or 120Ω, and so on depending upon the particular requirements for a given implementation. In contrast, the data strobe channels (or channel in single-data-rate embodiments) end in corresponding capacitive terminations that have an impedance that does not match the resistive characteristic impedance for the data strobe channels. By eliminating the resistive terminations that are conventionally used for the data strobe channels, substantial power savings are realized in that resistive terminations have an ohmic loss associated with them.

Figure 1:
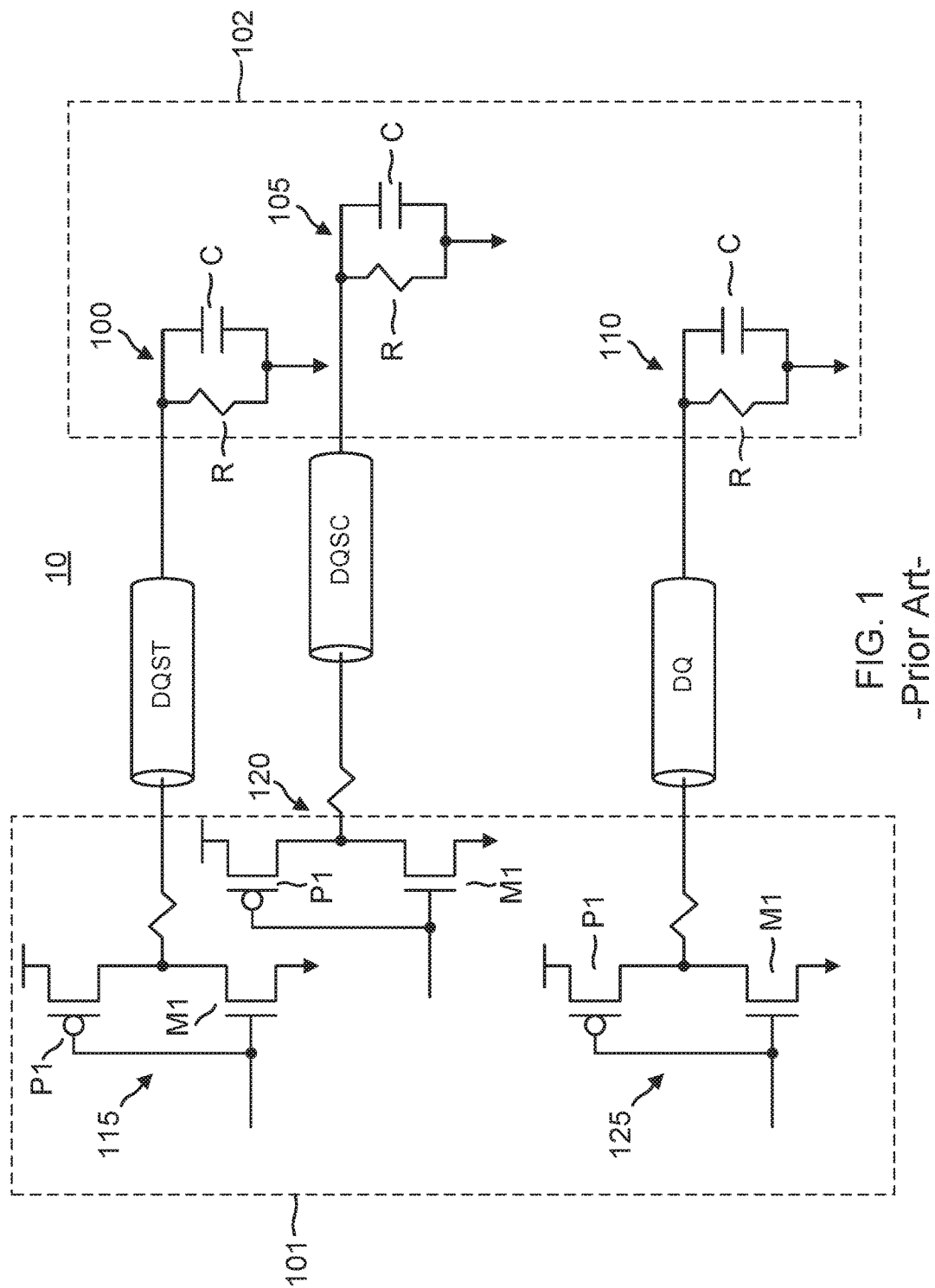
FIG. 1 is a circuit diagram of a conventional source-synchronous system.
Figure 2:
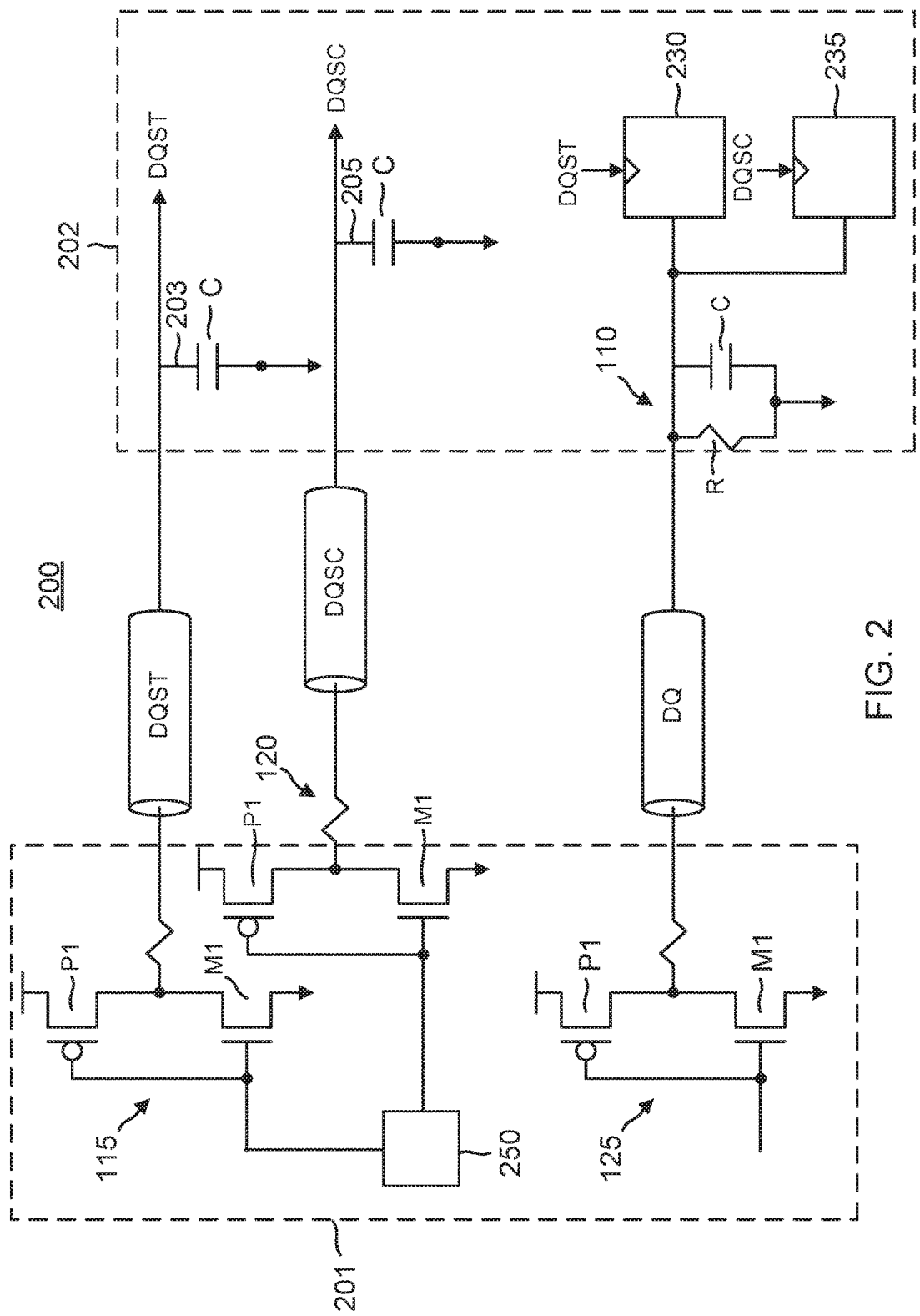
FIG. 2 is a circuit diagram of a source-synchronous system in which the data sink endpoint includes mismatched terminations for the data strobe and data channels.

An example source-synchronous system 200 is shown in FIG. 2. A data source endpoint 201 such as an SOC or other suitable integrated circuit operates analogously as discussed with regard to data source 101 of FIG. 1 in that data source 201 includes single-ended data strobe drivers 115 and 120 that are matched to data driver 125. Each single-ended driver comprises an inverter formed from a PMOS transistor P1 in series an NMOS transistor M1. Data strobe driver 115 drives a data strobe true channel (DQST). Similarly, data strobe driver 120 drives a data strobe complement channel (DQSC). In addition, data driver 125 drives a data (DQ) channel. In some embodiments, the DQ channel carries a single binary data signal. In other embodiments, the DQ channel may be part of a series of such channels as used in multi-wire coding. In yet other embodiments, the data transmission over the DQ channel may be multi-level instead of just binary.

A data sink 202 such as a dynamic random access memory (DRAM) integrated circuit receives the true and complement data strobe channels DQST and DQSC as well as the data channel DQ. The data channel DQ ends in an on-die resistive termination 110 formed such as by using a termination resistor R in parallel with a termination capacitor C. Resistive termination 110 is configured to have a resistive impedance that matches a resistive impedance for the data channel DQ. A typical value for such a resistive impedance is 50 to 60Ω but it will be appreciated that the resistance may be higher or lower than these values in alternative embodiments. Because of the matching, there are no undesirable reflections in the propagation of a data signal from data source endpoint 201 over data channel DQ to data sink endpoint 202.

In contrast, the DQST channel ends in an on-die capacitive termination 203 formed from a capacitor C such that an impedance for capacitive termination 203 does not match a resistive impedance for the DQST channel. Similarly, the DQSC channel ends in an on-die capacitive termination 205 formed from a capacitor C. As with the DQ channel, a typical impedance for the DQST and DQSC channels may be 50 to 60Ω although alternative embodiments may have a higher or lower resistance. Because of the mismatch, there will thus be reflections of the true and complement data strobes at capacitive terminations 203 and 205, respectively. But note that the true and complement data strobes are regular, repeating signals. Their reflections will thus also be non-random and can be trained out. For example, data source endpoint 201 may include a variable delay circuit 250 that can adjust a variable delay between the true and complement data strobes as compared to the data signal. During a training phase, data source endpoint 201 may send a training vector over the DQ data channel to resistive termination 110. Data sink endpoint 202 includes a pair of registers 230 and 235 having their data inputs coupled to resistive termination 110. Register 230 is clocked by the true data strobe received at capacitive termination 203. Similarly, register 235 is clocked by the complement data strobe received at capacitive termination 205. By varying the delay through variable delay circuit 250, data source endpoint 201 may obtain the maximum data eye for the received training sequence in registers 230 and 235. It will be appreciated that source-synchronous system 200 is shown having just one bit-wide data channel DQ and corresponding registers 230 and 235 for illustration clarity in that multiple data channels and corresponding registers may be used for the reception of bit-wide data words synchronous to a true and complement data strobe. Moreover, the non-uniform interface disclosed herein is not limited to the transmission of binary data. Multi-level data transmission could also be accomplished using data channels that are terminated analogously as shown for source-synchronous system 200.

With regard to the transmission of training vectors, it will be appreciated that the low power double data rate 4 (LPDDR4) standard also teaches the use of a variable delay for the data strobes as compared to the data channels (note that one can delay the data rather than the data strobe in the embodiments disclosed herein). In the LPDDR4 standard, the received data strobes in the data sink endpoint are buffered whereas the received data is not. There is thus a timing mismatch between the received data strobes and the received data in an LPDDR4 data sink endpoint. Because of this explicit mismatch, the data strobe is skewed with respect to the data signals at the data latches by 200 ps to 800 ps. To account for this skew, the LPDDR4 includes periodic training sessions in which the data source sends a training vector as the data word. In this fashion, the skew is trained out and accounted for. But just like the conventional systems discussed earlier, the on-die terminations and drivers are matched in LPDDR4 systems. The disclosed source-synchronous with non-uniform interfaces exploit the explicit mismatch allowed in the LPDDR4 standard to achieve dramatic power savings and more robust data strobe generation.

Figure 3:
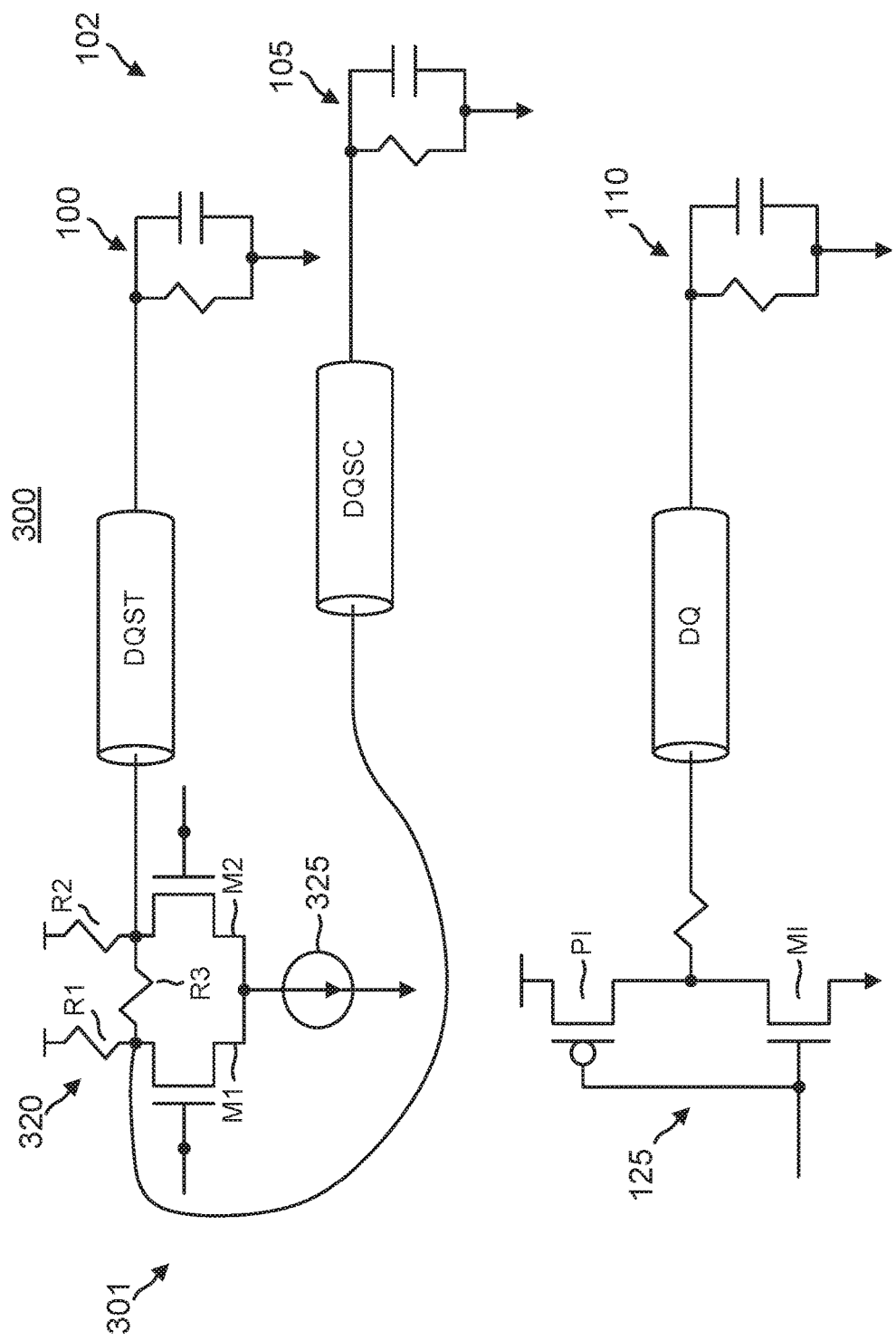
FIG. 3 is a circuit diagram of a source-synchronous system in which the data source endpoint includes a differential driver for the data strobe channels and a single-ended driver for the data channel.

The non-uniform interface with regard to the data channels and the data strobe channels may be extended to the drivers in data source endpoint 201. An example embodiment is shown for a source-synchronous system 300 in FIG. 3. A data source endpoint 301 drives the DQST, DQSC, and DQ channels analogously as discussed with regard to system 200 of FIG. 2. In addition, data sink endpoint 102 includes matched resistive terminations 100, 105, and 110 as discussed with regard to system 10 of FIG. 1. Similarly, single-ended data driver 125 in data source endpoint 301 endpoint drives data channel DQ analogously as discussed with regard to system 10. But matched single-ended drivers are not used to drive the DQST and DQSC data strobe channels. Instead, a differential driver 320 drives the true and complement data strobe channels. In particular, a pair of NMOS transistors M1 and M2 steer a bias current from a current source 325 responsive to a differential input voltage applied to the gates of transistors M1 and M2. The drain of transistor M1 couples to an input of the data strobe complement channel DQSC. Similarly, a drain of transistor M2 couples to an input of the data strobe true channel DQST. The drains of transistors M1 and M2 also couple to a power supply node through resistors R1 and R2, respectively. The drains of transistors M1 and M2 may be coupled together through a coupling resistor R3. As compared to the use of a single-ended driver, differential driver 320 produces a larger eye between the received true and complement data strobes at resistive terminations 100 and 105.

Figure 4:
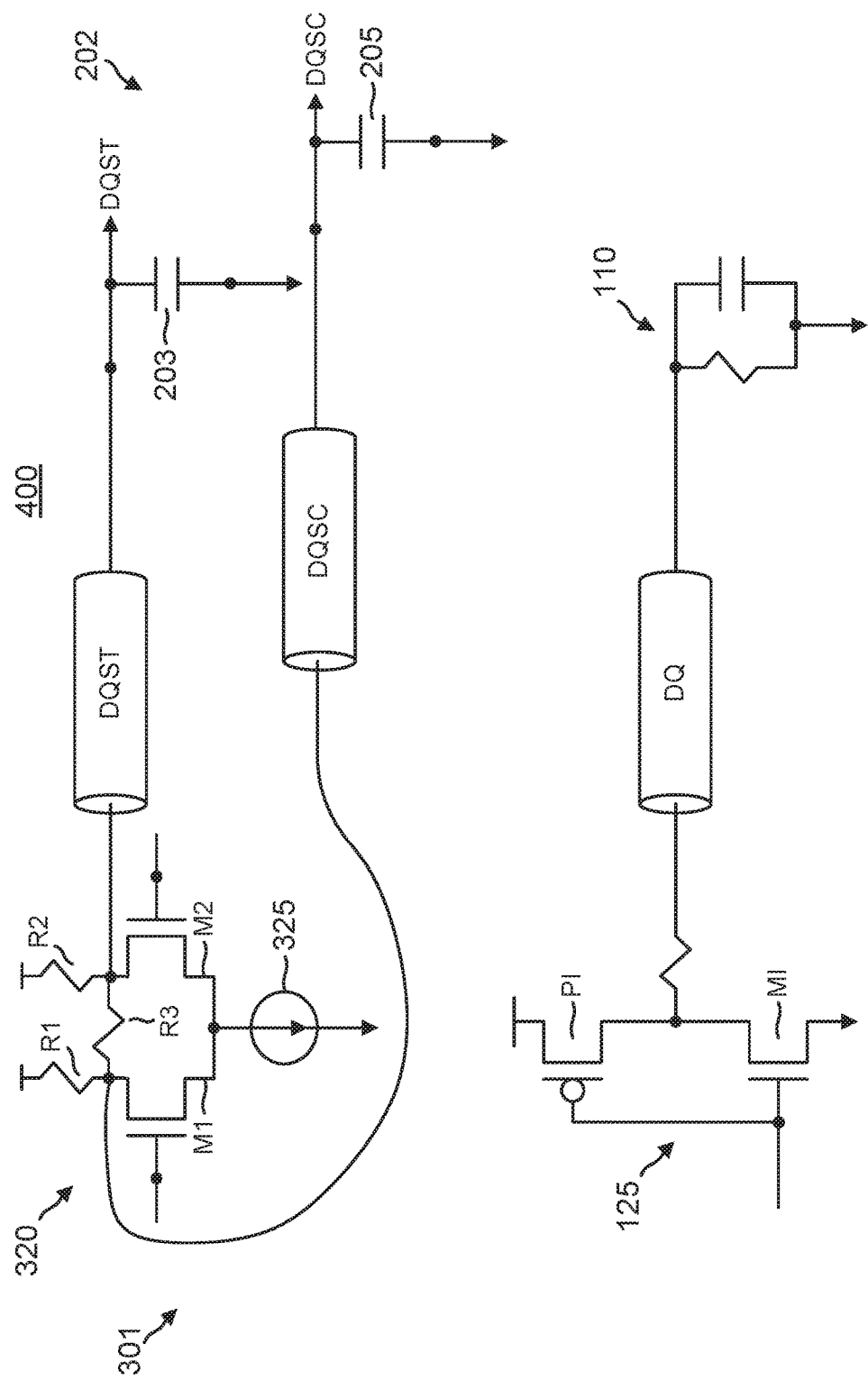
FIG. 4 is a circuit diagram of a source-synchronous system in which the data source endpoint includes a differential driver for the data strobe channels and a single-ended driver for the data channel and in which the data sink endpoint includes mismatched terminations for the data strobe and data channels.

In yet another alternative embodiment, both the drivers and the terminations may be mismatched. An example source-synchronous system 400 is shown in FIG. 4. System 400 combines data source endpoint 301 discussed with regard to system 300 with data sink endpoint 202 discussed with regard to system 200. For illustration clarity, registers 230 and 235 are not shown in FIG. 4.

Figure 5:
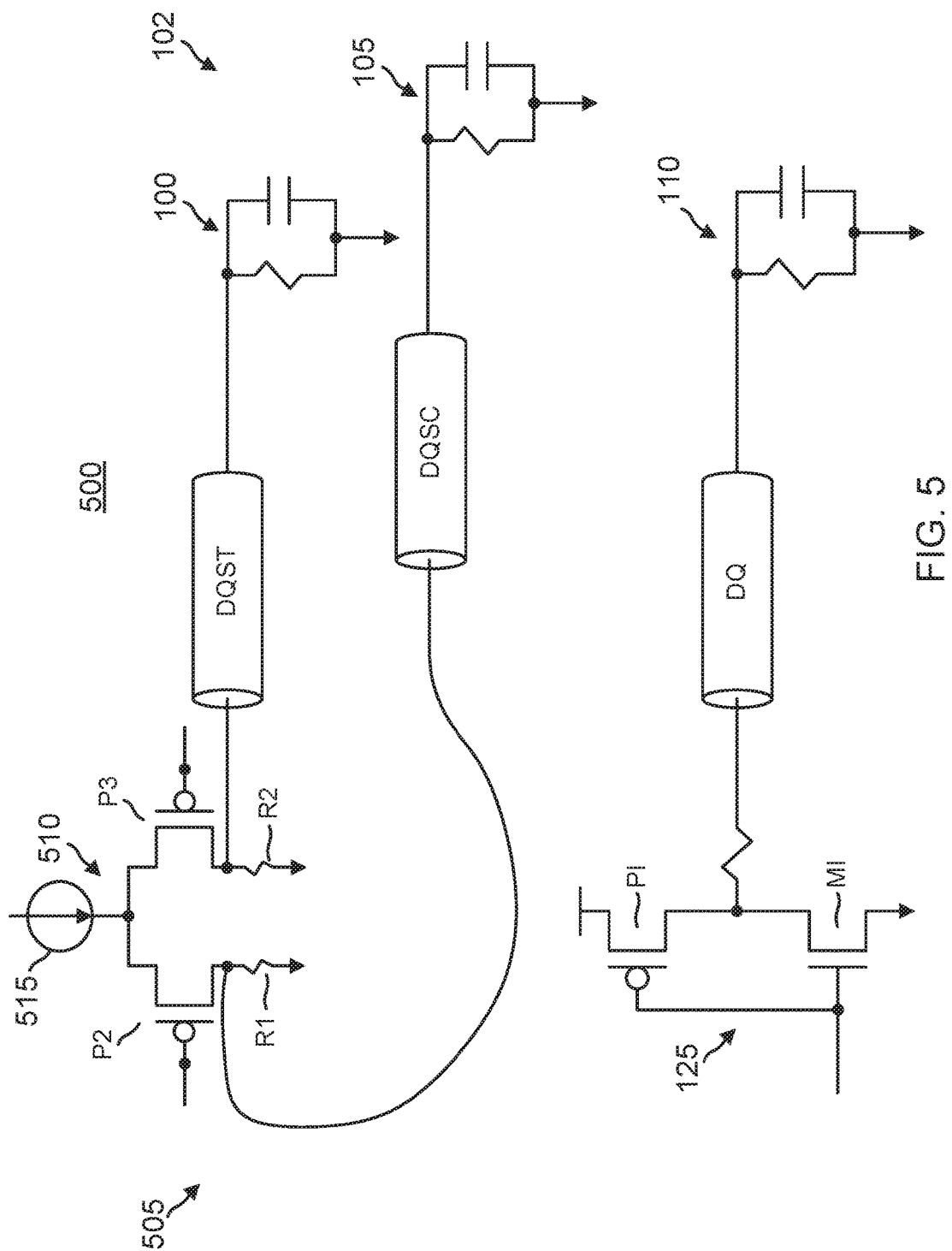
FIG. 5 illustrates a source-synchronous system including an alternative embodiment for the differential driver of FIG. 3.

Numerous alternative embodiments may be formed having mismatched drivers and/or terminations. For example, a source-synchronous system 500 shown in FIG. 5 includes a data sink endpoint 102 as discussed with regard to system 300. A data source endpoint 505 also includes a single-ended driver 125 for driving data channel DQ as discussed with regard to system 300. A differential driver 510 in data source endpoint 505 drives the true and complement data strobe channels DQST and DQSC. In contrast to differential driver 320 of FIG. 3, differential driver 510 shown in FIG. 5 includes a differential pair of PMOS transistors P2 and P3 having their drains coupled to ground through resistors R1 and R2, respectively. Transistors P2 and P3 steer a bias current from a current source 515 coupled to their sources responsive to a differential input voltage applied to their gates. The drain for transistor P2 couples to an input of the DQST data strobe channel. Similarly, the drain for transistor P3 couples to an input of the DQSC data strobe channel. In other embodiments, the capacitive terminations for the true and complement data strobe channels DQST and DQSC may be coupled to a power supply voltage through a weak pull-up resistor and/or coupled together through a coupling resistor (these resistors not matching the capacitive terminations to the resistive impedance of the data strobe channels).

Referring again to an embodiment in which the data sink endpoint comprises a DRAM integrated circuit, it will be appreciated that it is conventional for a data source endpoint to transmit a clock to the DRAM endpoint over a corresponding clock channel. The DRAM endpoint as disclosed herein may include an on-die capacitive termination for the clock channel analogous to capacitive terminations 203 and 205 as discussed for the data strobe channels DQST and DQSC. Such a capacitive endpoint for the clock channel saves additional power and increases the eye for the received clock at the data sink endpoint.

Figure 6:
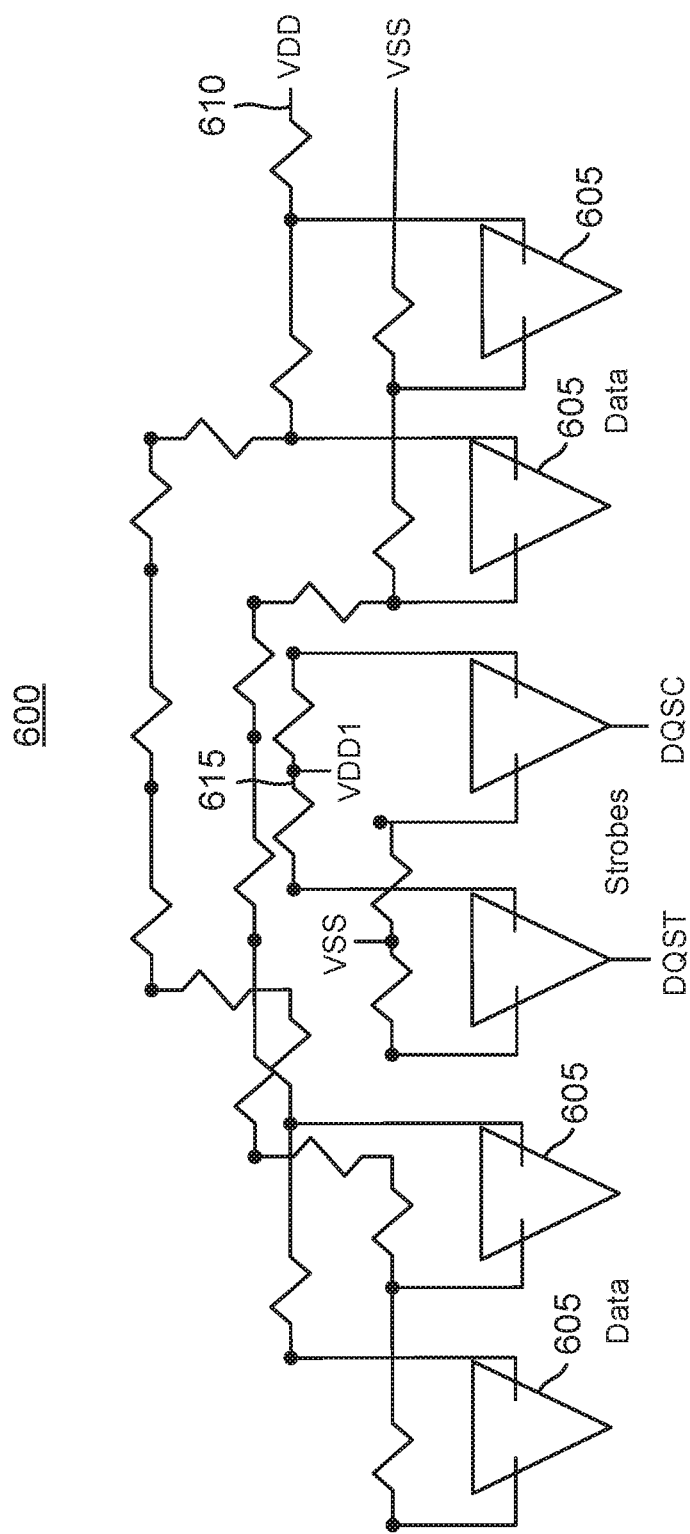
FIG. 6 illustrates separate ground and power networks for a data strobe driver and for data channel drivers.

Note only can the data strobe drivers be mismatched to the data drivers, but the power network supplying these drivers may be singulated from the power network for the data drivers. An example data source endpoint 600 is shown in FIG. 6 that includes a plurality of data drivers 605 all powered by a power supply node 610 providing a power supply voltage VDD with respect to ground VSS. An independent power supply node 615 provides a power supply voltage VDD1 for powering the data strobe drivers that drive the DQST and DQSC data strobe channels. In this fashion, the data strobe drivers are isolated from the random switching pattern of the data drivers 605. In addition, note that the data strobe channels DQST and DQSC as well as the data channel DQ are typically formed using patterned metal layers on a circuit board or other suitable propagation medium. Separate metal layers may be used for the data strobe channels to further isolate the data strobes from the random nature of the data transmission.

Figure 7:
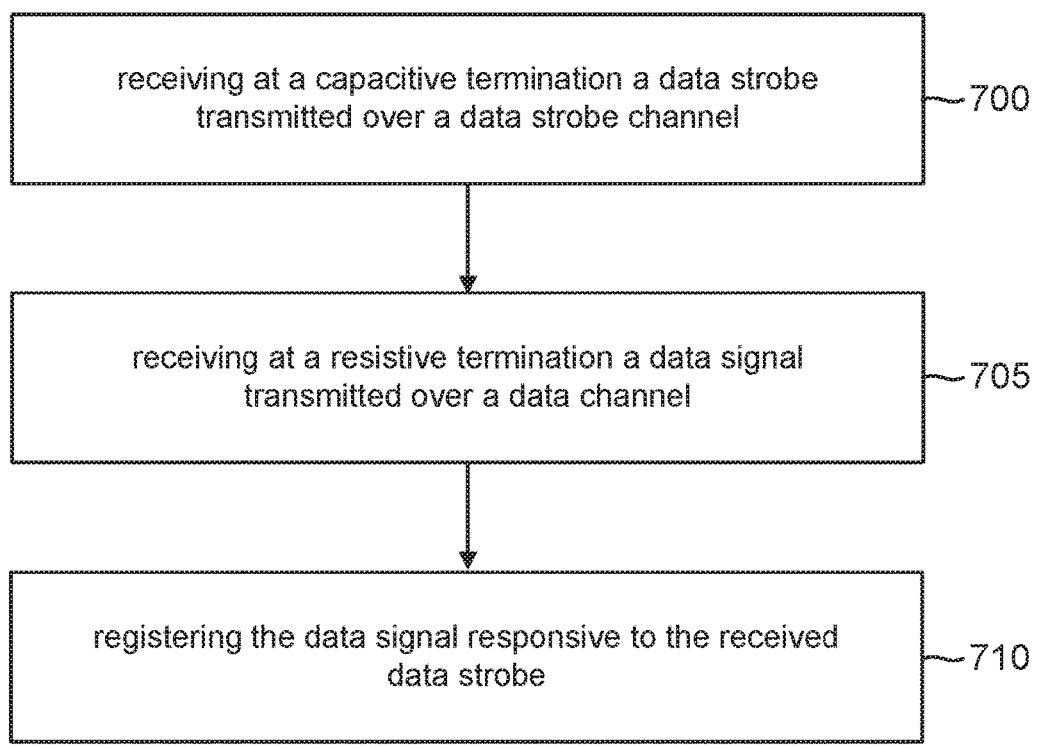
FIG. 7 is a flowchart of an example method of operation for a source-synchronous data sink endpoint having mismatched data strobe and data channel terminations.

A flowchart shown in FIG. 7 for an example method of operation for a source-synchronous system having non-uniform interfaces will now be discussed. A first act 700 comprises receiving at a capacitive termination a data strobe transmitted over a data strobe channel. An example of such an act is discussed above with regard to the reception at capacitive terminations 203 and 205. The method further comprises an act 705 of receiving at a resistive termination a data signal transmitted over a data channel. The reception of data at resistive termination 110 discussed above is an example of act 705. Finally, the method includes an act 710 of registering the data signal responsive to the received data strobe. An example of such an act is discussed above with regard to registers 230 and 235.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A source-synchronous data source endpoint, comprising:
a differential data strobe driver configured to drive a true data strobe channel and a complement data strobe channel, wherein the differential data strobe driver includes a differential pair of transistors configured to steer a bias current; and
a single-ended data driver configured to drive a data channel, wherein the single-ended data driver comprises an inverter.

2. The source-synchronous data source endpoint of claim 1, wherein the differential pair of transistors comprises a differential pair of NMOS transistors.

3. The source-synchronous data source endpoint of claim 2, wherein a source for each of the NMOS transistors couples to ground through a current source for the bias current.

4. The source-synchronous data source endpoint of claim 2, wherein a drain for each of the NMOS transistors couples to a power supply node through a resistor.

5. The source-synchronous data source endpoint of claim 1, further comprising:
   a first power supply network configured to supply power to the single-ended data driver; and
   a second power supply network configured to supply power to the differential data strobe driver, wherein the first power network is independent from the second power network.

6. The source-synchronous data source endpoint of claim 1, wherein the source-synchronous data source endpoint comprises a system-on-a-chip (SOC).

7. The source-synchronous data source endpoint of claim 1, wherein the differential pair of transistors comprises a differential pair of PMOS transistors.

8. The source-synchronous data source endpoint of claim 7, wherein a source for each of the PMOS transistors couples through a current source for the bias current to a power supply node.

9. The source-synchronous endpoint of claim 7, wherein a drain for each of the PMOS transistors couples through a resistor to ground.

10. The source-synchronous system of claim 1, wherein the single-ended data driver comprises a plurality of single-ended data drivers.

11. A method, comprising:
    from a data source endpoint, steering a bias current through a differential pair of transistors to differentially drive a data strobe over a true data strobe channel and a complement data strobe channel; and
    from the data source endpoint, single-endedly driving a data signal through an inverter over a data channel.

12. The method of claim 11, further comprising:
    transmitting a training vector over the data channel; and
    adjusting a delay for the differential driving of the data strobe to maximize a data eye for a received version of the training vector.

13. The method of claim 11, wherein steering a bias current through a differential pair of transistors to differentially drive the data strobe comprising differentially driving the data strobe to a dynamic random access memory (DRAM) endpoint.

14. The method of claim 11, further comprising independently powering the differential driving of the data strobe with respect to the driving of the data signal.

15. The method of claim 11, wherein single-endedly driving the data signal comprises single-endedly driving a multi-level data signal.

* * * * *